United States Patent [19]

Buselmeier et al.

[11] Patent Number: 4,792,878
[45] Date of Patent: Dec. 20, 1988

[54] HEAT DISSIPATING HOUSING FOR A CIRCUIT COMPONENT

[75] Inventors: Bernhard Buselmeier, Munich; Herbert Prussas, Reichertshausen/Ilm, both of Fed. Rep. of Germany

[73] Assignee: Siemens Aktiengesellschaft, Berlin and Munich, Fed. Rep. of Germany

[21] Appl. No.: 900,111

[22] Filed: Aug. 25, 1986

[30] Foreign Application Priority Data

Aug. 30, 1985 [DE] Fed. Rep. of Germany ....... 3531136

[51] Int. Cl.$^4$ .............................................. H05K 7/20
[52] U.S. Cl. ................................... 361/383; 361/388; 357/79
[58] Field of Search ............................... 361/386–388, 361/383; 357/79, 81, 80; 174/16 HS, 52 FP

[56] References Cited

U.S. PATENT DOCUMENTS

| | | | |
|---|---|---|---|
| 3,826,953 | 7/1974 | LeGaler | 361/386 X |
| 4,008,487 | 2/1977 | Vogt | 357/79 X |
| 4,246,597 | 1/1981 | Cole et al. | 357/79 X |
| 4,415,025 | 11/1983 | Horvath | 361/386 X |
| 4,451,540 | 5/1984 | Baird et al. | 174/52 FP |
| 4,524,238 | 6/1985 | Butt | 175/52 FP |
| 4,546,028 | 10/1985 | Val | 361/386 X |

FOREIGN PATENT DOCUMENTS

| | | |
|---|---|---|
| 0172485 | 2/1986 | European Pat. Off. . |
| 0171051 | 2/1986 | European Pat. No. . |
| 3129996 | 2/1983 | Fed. Rep. of Germany . |

OTHER PUBLICATIONS

IBMTDB, Eckenbach et al, "Semiconductor Module with Heat Transfer", vol. 20, No. 12, May 1978.

IBMTDB, "New Coating for Radial Finger Cooling", vol. 28, No. 12, May 1986.

Primary Examiner—A. D. Pellinen
Assistant Examiner—A. Jonathan Wysocki
Attorney, Agent, or Firm—Adel A. Ahmed

[57] ABSTRACT

A heat dissipating housing (W/Gl/G) for a circuit component (IC) consists of at least one bottom tub (G) and a cover (W) having a planar cover face. A frame-shaped portion of this cover face serves as a bearing surface (TF) for meeting a planar bearing surface (TF) of the sidewalls (G1) of the bottom tub (G). Both bearing surfaces (TF) are finally fastened together. At least parts of the cover's outside surface (W) are cooled in operation by a cooling medium (KL), dissipated heat being conveyed from the circuit component (IC) via a stiff heat conducting body (SC1, SC2) and a good heat conductor element consisting of elastic material (FE/WS/WL) to the cover (W). In each instance, at least one good heat conductor spring structure (WL/WS) with feather tongues (WL) is inserted in lateral gaps between the heat conducting body (SC1, SC2) and at least two of the sidewalls (G1) of the bottom tub (G) in an expanding manner by means of its feather tongues (WL) so that these spring structures (WL/WS) adhere through friction forces. The element (FE) and the spring structures (WS/WL) are formed as a cohering spring unit (Fe/WL/WS) from a single piece of spring plate with a center part (FE) and side parts (WS). The good heat conductor cover (W) is connected with the center part (FE) firmly and heat conductingly. Centering retention of cover (w) by the spring unit inhibits displacement of cover (w) relative to the sidewalls.

10 Claims, 2 Drawing Sheets

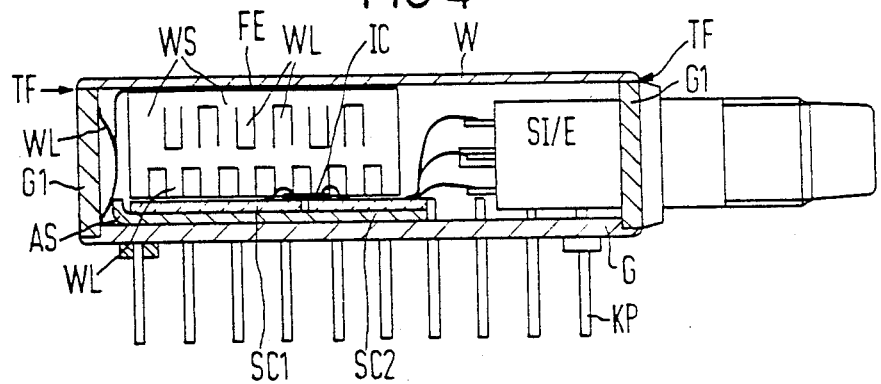
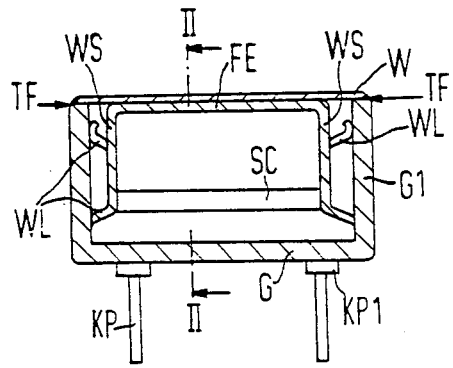
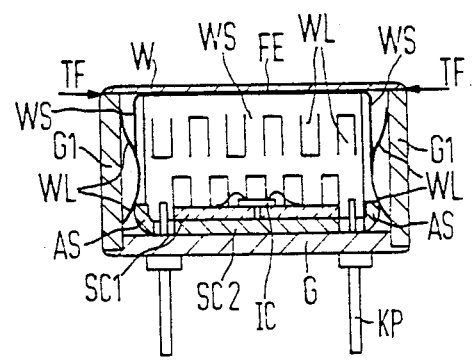
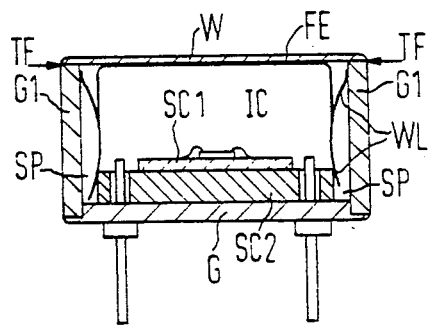
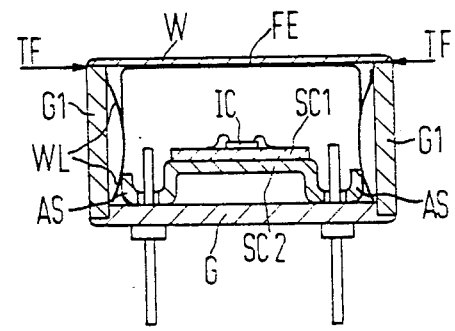

HEAT DISSIPATING HOUSING FOR A CIRCUIT COMPONENT

BACKGROUND OF THE INVENTION

1. Technical Field

The invention relates to the field of heat-dissipating housings for electronic circuit components.

2. Description of the Prior Art

A heat dissipating housing is described in the European patent Nos. 0171051 and 0172485 which comprises a tub and a lid. The heat resistance between the circuit component contained therein and a cooling medium is there substantially reduced, that is, the cooling of the circuit component improved, by a heat conduction plate on which several spring structures and at least one spring element are secured.

Actually the invention there disclosed was developed for a high data speed 200-Mbit/sec light emitting diode module housing with an infrared emitting diode and a driver chip described in the older application, where the high dissipated heat, e.g. 1 W for the driver having an operating temperature of e.g. 125° C., is to be given off as quickly as possible to a cooling medium flowing over the housing, the cooling medium having an initial temperature of about 40° C. and a speed of 100 m/min. Without very special cooling measures, the driver chip will become too hot and is then no longer operationally safe. But the invention is suitable also for a housing containing any circuit component to be cooled well.

It is the object of the present invention to simplify the manufacture of the disclosed housing, and the problem has two aspects:

Firstly, it is desirable to produce a good heat removal from the semiconductor body to the cooling medium, that is, to the outer surface of the housing to be cooled, especially directly to the cover of the housing, but, if needed also, to individual ones or to all of the sidewalls of the bottom tub. Hence the dissipated heat flows from the circuit component

- via the spring structures directly to the cover and thence to the cooling medium, and/or
- via the spring structures and via the bottom tub sidewalls touched by them and directly via their outer surfaces to the cooling medium, and/or
- the spring structures and via these bottom tube sidewalls first upward to the cover and over the outer surface thereof to the cooling medium.

The described spring structures, the at least one spring, the element and the cover must be especially easy to manufacture.

Secondly, at the same time, adjusting and centering of the cover on the bottom tube before it is secured is to be achieved by especially simple means, so that, without additional adjusting measures during mass production, the danger of the cover slipping out of place while being secured—preferably, heremetically tight—on the bottom tub, that is, for instance, on being soldered or roll seam welded, is reduced. The invention thus simplifies also the attachment of the cover to the bottom tub, in that it is no longer necessary to apply adjusting means, such as additional bosses, stops or bevels, on the cover and/or on the sidewalls of the bottom tub to avoid slippage of the cover. However, the present invention permits carrying out such adjusting measures easily while obtaining a still improved centering precision.

SUMMARY OF THE INVENTION

These objectives are achieved by the measures recited in patent claim 1.

The measures recited in the sub-claims permit achieving additional advantages.

In accordance with a first aspect thereof, the invention enables dissipation of a portion of the heat via the housing bottom and thence upward via the housing walls to the cooling medium, and/or

- to be able to first mount the circuit component, such as a housingless driver chip, firmly on the heat conducting body or on a support, firmly connectable or connected with the heat conducting body, such as a ceramic support, and to test it, for example, even before the heat conducting body is fitted with the circuit component—the heat conducting body in particular, consisting of metal, in particular, a CuMo alloy—and is fixed on the bottom of the bottom, for example, by spot welding or by soldering in a manner suitable also for mass production, and/or
- to be able to reach an increased heat capacity near the circuit component in the interior of the housing for the buffering of high heat peaks.

In accordance with a second aspect thereof, the invention permits the housing to obtain an increased contact area between the heat conducting body and the spring structure, for example, for improving the transfer of heat from the heat conducting body to the respective spring structure, and/or

- to make an especially deep side gap, into which the contacting spring structure can be inserted particularly deep and, hence, especially well adhering.

In accordance with a third aspect thereof, the invention permits the housing to obtain an especially rigid centering of the cover on the bottom tub, before the attachemnt of the cover to the bearing surface of the bottom tub sidewalls, thereby

- reducing the danger of the cover slipping out of place while being attached—by, for example, a roll seam welding process—on the bearing surface of the bottom tub sidewalls.

In accordance with a fourth aspect thereof, the invention permits the housing to obtain a relatively small heat-conducting-body coefficient of thermal exapnsion of approximately $9 \times 10^{-6} K^{-1}$ (e.g. identical to that of many ceramics such as the ceramic support SC1 shown in FIGS. 4 to 7), as well as a high heat-conducting-body thermal conductivity, namely, about 226 W/m.K.

In accordance with a fifth aspect thereof, the invention permits the housing to obtain an especially high spring-plate heat conductivity of approximately 230 W/m.K at high spring plate elasticity.

In accordance with a sixth aspect thereof, the invention permits the use, in a manner favorable for mass production, of a customary ceramic support as a direct circuit component support, where the circuit component may be a chip selective to high temperatures, that is, to accumulated heat and/or a printed resistance-layer circuit.

In accordance with a seventh aspect thereof, the invention permits the housing to obtain on the heat conducting plate at one point an electrically insulating and at another point an electrically conducting contact to the ceramic support underside.

In accordance with an eighth aspect thereof, the invention protects a circuit component, for example, a housingless semiconductor chip, which is sensitive to certain gases such as water vapor.

The invention and its variants are explained further with reference to the examples shown in the figures.

BRIEF DESCRIPTION OF THE DRAWINGS

FIGS. 2 and 3 show a first example in two sections perpendicular to each other, this example representing a housing for a light emitting module, to be connected to a glass fiber, of an optoelectronic communications system, including a driver chip circuit component giving off its heat to the housing sidewall and/or to the cover via the spring unit shown comprising two spring structures or side parts;

FIGS. 4 and 5 show a second example in two mutually perpendicular sections, where this example also represents a housing for a light emitting module to be connected to a glass fiber, including a driver chip circuit component giving off its heat via the spring unit shown here comprising three side parts;

FIG. 6 show a third example with a very massive heat conducting body; and

FIG. 7 shows a fourth example with a thin, hollow, more precisely, bridge-like, heat conducting body.

DETAILED DESCRIPTION

Figure 1:
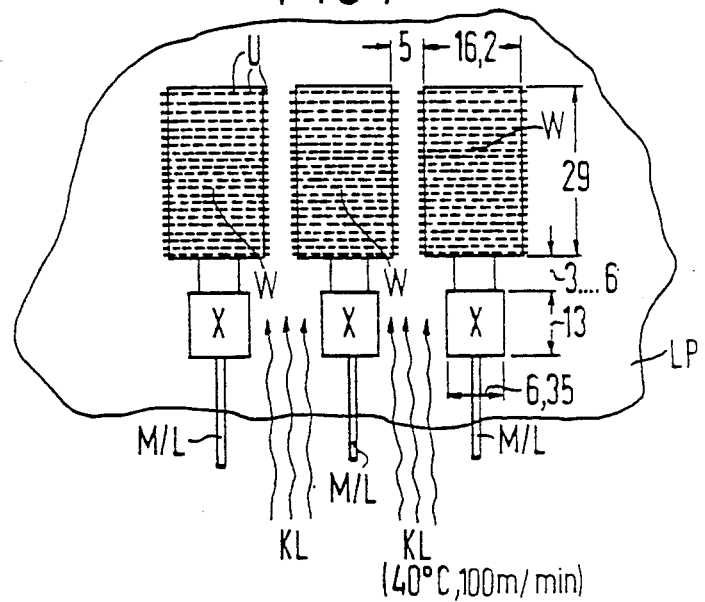
FIG. 1 shows, to explain the objective of the invention, a practical example already described in the older applications for cooling housings—however, constructed according to the invention—under extremely restricted space conditions and an accordingly difficult supply of cooling medium.

FIG. 1 does not specifically show the measures according to the invention. It serves essentially to explain the objective of the invention by illustrating an extreme application, in which the measures per the present invention explained with reference to FIGS. 2 through 7 have proven especially successful.

Figure 2:
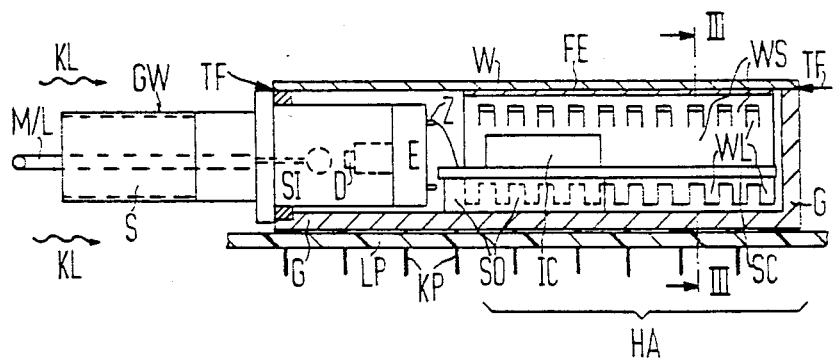

This FIG. 1 shows a top view of a printed circuit board/apertured board LP, into holes of which board the electroconducting plug pins of the housings disposed very closely together are inserted, for example, the plug pins KP in FIGS. 2, 3 and 4, their spacers KP 1 (FIG. 3) determining the distance between the apertured board LP and the housing underside. Because it shows a top view, one looks in FIG. 1 onto the curves W—equipped with many cooling fins U—of these housings, refer also to FIGS. 2 and 4. These covers W prevent in FIG. 1 the view of the bottom tubs G, G1 lying below the covers.

For many applications, an extremely large number of such housings are needed, for example, for an optoelectronic telecommunications system. In such applications, the housings should be as small as possible, for example, 48 mm×16.2 mm×8.4 mm which is measurement data for the FIG. 1 housings, disposed very close together, and should be cooled by strong air blowers. The cooling medium, generally cooling air KL, first cools the secondary housing of the light emitting diode D and, thereafter, the housing of the driver chip IC. Because of the shortage of space, the cooling occurs only via the cover W and to a very limited extent via the other surfaces G/G1.

Despite the extreme shortage of space, the housings must be cooled very well, even when the light emitting diode D and the driver chip IC is operated near its highest permissible operating temperature. At 1 W dissipated power, the rear driver chip IC may reach at most 125° C. The cooling air KL then must have a velocity of 100 m/min and an initial temperature of 40° C.

All examples shown in FIGS. 2 to 7 may serve as 200-Mbit/sec light emission modules. Actually, each sample comprises an optical plug S, where the cap nut X thereof is shown in FIG. 1, as well as its thread GW in FIG. 2 as well as its sheathed glass fiber L with sheath M shown as M/L. In addition, each module comprises as is shown in FIG. 2, a light emitting diode D, which is contained in a secondary housing SI/E with hollow body SI and closure E on a sidewall G1 of the bottom tub G between the optical plug S and the circuit component IC. In the other figures, FIGS. 2 to 7, this glass fiber L and the secondary housing SI/E with its light emitting diode D and plug pins KP are not shown for greater clarity. In this manner, the spring unit FE/WS/W1 with heat conducting body SC, SC1 for cooling the circuit component IC is more easily seen. But the invention relates not only to optoelectronic housings, but heat dissipating housings generally.

The examples shown in FIGS. 2 and 4 show for a circuit component requiring heat dissipation only a driver chip IC, to which the light emitting diode D may be connected by the lines Z through the closure E of the secondary housing SI/E. But, again the present invention relates to any circuit componenets giving off heat to be dissipated.

Known from the two prior patent applications, special cooling measures are described which in such extreme cases reduce the danger of overheating the circuit component. The measures described there are usable successfully also in the housing constructed according to the present invention.

Especially in the first named older application—especially with reference to the FIGS. 1, 4 and 5 shown therein—it has been already described that to this end heat conducting spring structures are useful as well as an element made of elastic material, touching the cover, together with a massive heat conducting body in the manner as defined in the preamble of claim 1.

The present invention simplifies the manufacture of such housings comprising a cover, a het conducting body, spring structures and an elastic element in two ways, firstly, in that the production of feather spring structures and of the elastic element as a single common spring unit of a single, stamped and appropriately bent spring plate is greatly simplified without loss of cooling ability, and secondly in that the attachment of the cover to the bottom tub—by roll seam welding of the cover—is greatly simplified by the additional use of this spring unit as a centering mount which renders it difficult or prevents displacement of the cover.

This simplification of the manufacture of the housing is achieved even with a completely planar, that is, groove-free or stop-free flat disk for a cover, as is shown in FIGS. 2 to 7.

All housings W, G1, G shown in FIGS. 2 to 7 consist in each instance of at least two parts, namely a bottom tub G/G1 and a cover W with a substantially planar underside, which parts may in each instance respectively consist also of several parts, for example, the bottom tub consisting of a bottom plate G and a separate sidewall frame G1, as is shown in FIGS. 4 to 7.

A frame-shaped outer portion of the planar cover underside serves without grooves and without a stop as a bearing surface TF for the substantially also planar cohering bearing surface TF of the sidewalls G1 of the bottom tub. The bearing surface TF of the sidewalls G1 lastly is fastened on the frame-shaped portion of the cover W by soldering or welding or, in particular, roll seam welding, where especially in roll seam welding, the danger of displacement of the cover W, planar on the underside, off the sidewalls G1 is especially great.

The cover W may consist entirely of metal, for example, Vacon (FeNiCo alloy), Vacodil (FeNi alloy) or special steel, as may also the bottom tub.

In the housing, a heat conduction plate SC or SC2 of good heat conduction and intermediate heat storage properties is secured, as shown, in FIG. 2 on a pedestal SO at the bottom of the bottom tub, and as shown in FIGS. 4 to 7, directly on the bottom. At least a portion of the dissipated heat is transmitted from the circuit component IC via the stiff heat conducting body SC (FIGS. 2 and 3) as well as SC2 (FIGS. 4 to 7), generally connected rigidly with the circuit component IC, and further via the spring element FE/WS/W1 of elastic material of good heat conduction, to the cover W. Thus, the invention permits the spring unit FE/WS/WL to press as desired laterally only—that is, horizontally in FIGS. 2 to 7—or otherwise additionally vertically, against the massive, stamped out, heat conducting body SC/SC2.

In the invention, a lateral spring structure WL/WS of good thermal conductivity of the spring unit FE/WS/WL expands and braces itself by means of several feather tongues into lateral gaps between the heat conducting body SC, SC2 and the bottom tub sidewalls. One such spring structure WL/WS expands at least into two substantially parallel lateral gaps between the heat conducting body SC, SC2 on the one hand and two mutually opposite sidewalls G1, on the other hand. Thereby the two lateral spring structures WL/WS adhere by friction forces to the inner surfaces of the sidewlls G1 as well as to the heat conducting body SC, SC2.

In the invention, also the center part FE of the spring unit and the spring structure WS/WL including its feather tongues ML jointly form a single cohering spring unit FE/WL/WS, which is made of a single piece of spring plate comprising a center part FE and resilient side parts WS with the feather tounges WL. The heat-conducting cover W may be connected firmly and with good heat conduction with the center part FE of the spring unit FE/WS/WL by spot welding. In the invention, the center part FE of FE/WS/WL corresponding to the elastic element thus consists of spring plate, that is, of highly elastic material like the elastic element of the older application. But in the present invention, the center part, which corresponds to the elastic element of the older applications, is not in every case utilized for the generation of vertical spring forces, that is, vertically to the cover W, shown in FIGS. 2 to 7.

The geometric dimensions, the spring forces, and hence also the friction forces of the spring unit FE/WS/WL are selected so that—after placing the cover W on the sidewalls G1 of the bottom tub, but before finally attaching the cover W to the sidewalls G1, the spring unit FE/WS/WL forms a centering mount for the cover W. Upon the later attachment of the cover W, the centering mount makes difficult or prevents a displacement of the cover W relative to the sidewalls G1 of the bottom tub G. For attaching the cover W, therefore, one inserts the spring unit FE/WS/WL into the bottom tub G1/G so that the spring structures WS/WL of the spring unit slip into lateral gaps between the heat conducting body SC, SC2 and the respective sidewalls G1 and there become clamped through friction forces, so that displacement of the cover W—especially in the case of roll seam welding—on the bearing surface TF of the sidewalls G1 is rendered difficult or is prevented. Only in special cases will an additional centering measure be necessary—preferably on the outer surface of the cover, such as a depression in the outer surface of the cover, which may be of any desired form, into which during attachment by roll-seam welding, a spike additionally holding the cover engages from the outside. But then the spring unit according to the invention before the engagement of the spike renders an at least preliminary centering of the cover—both against lateral and against rotational displacement of the cover, which may further considerably facilitate mass production of the housings.

FIG. 3 shows a vertical section through the view of the first example shown in FIG. 2. FIG. 3 thus shows a section through the lateral parts WS of the spring unit FE/WS/WL, whereby the expanded feather tongues WL and their bracing action causing friction forces in the lateral gaps are recognizable better than from FIG. 2. The relatively narrow resilient feather tongues also are capable of torsion and therefore have a relatively large contact area which, if needed, also ensures an especially good heat transfer between, on the one hand, the respective feather tongues WL and the areas touched by it, that is, the bottom tub sidewall G1 in FIGS. 2 to 7, or the heat conducting body SC in FIGS. 2 and 3 as well as SC2 in FIGS. 4 to 7.

FIGS. 4 to 7 show three additional housing examples, where the heat conducting body SC2 firmly connected with the circuit component IC is fastened directly on the bottom of the bottom tub G. The structural height of the heat conducting body SC2, that is, the distance of its upper surface from the bottom of the bottom tub, is preferably selected so that the terminals of the circuit component IC as well as the terminals of a circuit component support SC1, consisting preferably of ceramic, which can further support lead wires or discrete components such as capacitors and/or thick film circuits, such as film resistors, lie approximately in the same plane as the ends of the plug pins KP toward the interior of the housing, to facilitate the subsequent bonding of electrical connecting (e.g. gold) lead wires. This especially applies when all electrical parts except for the bonding wires are applied first on the (ceramic) support SC1,
  when then the support SC1 is firmly glued onto the heat conducting body SC2, which was first firmly applied in the bottom tub preferably by spot welding, and
  when only thereafter the connecting wires are attached preferably automatically by a manipulator.

Often it is advisable to make the heat conducting body SC, SC2 quite massive, that is, not too thin, to increase its thermal conductivity as well as its heat storage capacity. But if it is still relatively thin, and especially if it is fastened directly at the bottom tub's bottom, it is often advisable to increase the heat contact surface and hence improve the heat transfer from the heat conducting body SC, SC2 to the spring structure WS, and often also
  to improve the friction of the spring structures WS/WL in the lateral gap by bending the outer edges AS of the heat conducting body SC2 touching the spring structure W/WL toward the cover W, as shown in FIGS. 4, 5 and 7.

Actually, when placing the flat-bottomed cover W on the bottom tub G, G1, the spring unit already exerts a centering force component in the longitudinal direction, namely parallel to the sheet plane in FIGS. 2 and 4 and perpendicular to the sheet plane in FIGS. 3 and 5, when only the friction of the spring structures in the lateral gaps causes the centering. But this centering force component acting in the longitudinal direction can easily be further increased by additional measures on the spring unit.

In the example shown in FIGS. 4 and 5, unlike the example shown in FIGS. 2 and 3, the spring unit FE/WS/WL made of a single piece of spring plate comprises not two, but three, spring structures, that is, lateral parts WS/WL, of which the third spring structure, also hanging on the center part FE, braces itself into the third lateral gap between the heat conducting body SC2 and a third sidewall G1 of the bottom tub. This third lateral gap, therefore, is oriented substantially prependicular to the two other sidewalls G1. The third spring structure increases not only the dissipated heat removal from the heat conducting body SC2 directly to the cover W as well as directly to the bottom tub sidewalls G1, but it also increases the centering action on the flat-bottomed cover W, because the third spring structure WS/WL, shown in section in FIG. 4, now exerts an additional centering force component in that longitudinal direction parallel to the sheet plane of FIG. 4, that is, prependicular to the sheet plane of FIG. 5.

An additional, especially great centering force in the same longitudinal direction can be achieved also by still other measures on the spring unit. Thus, as is shown in FIG. 2, even if only two spring structures WS are applied, the spring structures WS/WL may be dimensioned so that after the cover has been placed on the bottom tub, the vertical end edge, lying to the right in FIG. 2, of these spring structures touch more or less the inner surface of the sidewall of the bottom tub lying still farther to the right thereof and shown in section, as a stop, and especially so when during roll seam welding of the cover W one lets the rollers run over the housing so that the rollers press the cover W into that longitudinal direction against the bottom tub sidewall serving as the stop.

Also in another way an especially great centering force can be achieved (not shown in the figures) in that at least one of the spring structures WS/WL has a section which laterally engages around the heat conducting body SC, SC2—that is, which touches an edge or face of the heat conducting body SC, SC2 which is pivoted by at least 45° against that heat conducting body edge AS or face which most of the other sections of this spring structure WS/WL touch. Then the respective section of the spring structure has a centering force component acting in the longitudinal direction.

The dissipated heat removal can be further increased by a skillful selection of materials. For example, one may make the heat conducting body SC, SC2 of a CuMo alloy—0.5 mm thick—with 53% Mo component, which at $+20°$ to $+100°$ C. has, in the mean, a thermal conductivity of 226 W/m.K, while silver Ag has a conductivity of 419 and copper Cu, 385 W/m.K. In addition, the CuMo alloy has at $+20°$ to $+100°$ C. almost the same coefficient of linear heat expansion, namely $9 \times 10^{-6} K^{-1}$ as the common ceramic supports, such as BeO ceramic/99.5% has, $9 \times 10^{-6} K^{-1}$ and $Al^2O_3$ ceramic/99.5%, $8.5 \times 10^{-6} K^{-1}$, but silver Ag has a coefficient of $20.5 \times 10^{-6} K^{-1}$ and copper Cu, $17.7 \times 10^{-6} K^{-1}$. Therefore, the ceramic support SC1 chips off from the CuMo heat conducting body SC2 more rarely at extreme operating temperature variations of from, for example, $-40°$ to $135°$ C. Compare with this also that for such operating temperature fluctuations in principle, the hard-to-machine Ti with a linear heat expansion of $8.6 \times 10^{-6} K^{-1}$ and a conductivity of 20 W/m.K as well as the very expensive Pt with coefficients of $9.3 \times 10^{-6} K^{-1}$ and 74 W/m.K respectively would likewise be suitable as heat conducting body material instead of the CuMo alloy if the heat conducting body SC2 is to be bonded with ceramic support SC1. For the spring plate, one should choose preferably a CuNiBe alloy, which is highly elastic and has at $+20°$ to $+100°$ a good thermal conductivity, namely 230 W/m.K.

If the circuit component IC is a chip, it is favorable to fasten it without a chip housing of its own directly on a ceramic support SC1 or directly on the heat conducting body SC, SC2, by glue or solder so that the heat flow resistance between the chip and the heat conducting body will be as small as possible. Also, for the same reason, only a good heat conducting thin flat support SC1, carrying also the leads to the chip IC as well as the chip IC itself, should be used, to remove the heat to be dissipated quickly via the spring unit and the cover—perhaps also via the spring unit and the bottom tub sidewalls—to the cooling medium.

If for circuitry reasons the top as well as the bottom side of the support has leads—in addition to the circuit component IC applied on its upper side away from the heat conducting body—it is often necessary to connect the circuit component underside (e.g. the chip's underside) to the potential of the housing. One can then place the housing potential present at the heat conducting body, perhaps even on the whole area, onto the underside of the support, that is, connect the heat conducting body with the support underside electroconductively on the whole area, whereby an electric contacting from the housing via a lead, that is via a through-contacting of the support, to the support top side and hence to the circuit component (chip) becomes possible.

Frequently also it may be favorable to connect only a part of the support underside electroconductively with the heat conducting body potential. For example, the support, carrying even on its top and underside, electrically uninsulated lines, perhaps even thick film resistances and/or similarly thin other electric parts on its underside, is glued onto the heat conducting body with two separate kinds of adhesives, namely in that one part of the lines of the underside of the support is glued on by means of an electrically insulating adhesive, but at least one other part of the underside of this support is glued by means of an electrically conducting adhesive.

Often it is necessary to fill the cavity in the housing with an inert shield gas, especially when a chip is applied directly, without its own chip housing, on the support. To this end, first the spring unit can be inserted into the bottom tub, then the shield gas filled in (perhaps with a previous heating of the then still open housing under vacuum), whereupon the cover, that is, after filling of the housing cavity with the inert gas, such as with water vapor-free $He-N_2$ mixture, is attached hermetically tight on the bearing surface TF of the sidewalls by roll seam welding.

FIGS. 6 and 7 show sections through two additional examples of the invention, in each instance respectively of FIGS. 3 and 5. Instead of applying the heat conducting body shown in FIG. 5, bent on three sides, on the bottom of the bottom tub, a correspondingly thick, not bent, heat conducting plate, preferably again of CuMo, can be applied with the same structural height, in which case the feather tongues of the spring structures can apply with large heat conduction area against the neatly producible lateral edges of this thick heat conducting plate. But a heat conducting body is suitable also such as a sheetmetal part stamped in bridge form as shown in FIG. 7, again with the same structural height.

In the invention and its developments one can also additionally apply the measures for the cooling of the circuit component which are described in the German Patent Application P No. 35 31 131.5 (VPA 85 P 1589 DE) of the same priority and filed concurrently herewith, now U.S. Ser. No. 900,070

Thus, there has been shown and described a heat dissipating housing including a new heat conducting means of one piece spring plate construction and other structural features whose elements should only be deemed to be limited in scope by the claims that follow.

We claim:

1. A heat dissipating housing with a circuit component giving off heat in operation, such as a driver chip where the housing consists of at least two parts, namely a bottom tub and a cover having a substantially planar cover surface, a frame-shaped planar portion of this planar cover serving as a bearing surface onto a substantially likewise planar bearing surface of sidewalls of the bottom tub, the bearing surface of the sidwalls lastly being fastened to the frame-shaped planar portion by, for example, welding or soldering, at least parts of an outer surface of the cover consisting entirely of metal, as well as other outer surfaces of the housing, such as outer surfaces of some of the sidewalls and cooled in operation by a fluid cooling medium, at least a part of the dissipated heat being conducted from the circuit component via a stiff heat conducting body and via a good heat conductor element comprising elastic material to the cover, and at least one good heat-conducting spring structure with feather tongues bracing itself in several lateral gaps between the heat conducting body on the one hand and at least two of the sidewalls of the bottom tub on the other hand, namely at least one spring structure each into the two substantially parallel lateral gaps between the heat conducting body on the one hand and two mutually opposite sidewalls on the other hand, in a manner expanding by means of its feather tongues so that the spring structures adhere in each instance by friction forces at the inner surfaces of these sidewalls as well as at the heat conducting body; for example, the housing being a housing for a 200 Mbit/sec light emitting module with optical plug and driver chip as well as with a light emitting diode applied in a secondary housing of the housing where this secondary housing is applied to one of the sidewalls of the bottom tub between the optical plug and the circuit component, characterized in that the element (FE) and the spring structures (WS/WL) including their feather tongues (WL) jointly form a single cohering spring unit (FE/WL/WS) which is produced from a single piece of spring plate with a centerpart (FE) and with resilient, lateral parts (WS) comprising the feature tongues (WL), the good heat conductor cover (W) is connected firmly and heat conductingly with the center part (FE) of the spring unit (FE/WS/WL), and the geometric dimensions, the spring forces and the friction forces of the spring unit (FE/WS/WL) are selected so that, after the cover (W) has been placed on the bottom tub (G, G1), but before the final attachment of the frame-shaped portion of the cover (W) to the bearing surface (TF) of the sidewalls (G1) of the bottom tub (G), the spring unit (FE/WS/WL) forms a centering retention—at least a certain resiliently yielding one—of the cover (W), which makes difficult or prevents a displacement of the cover (W) relative to the sidewalls (G1) of the bottom tub (G).

2. A housing according to claim 1 further characterized in that the heat conducting body (SC2) firmly connected with the circuit component (IC) is fastened to the bottom of the bottom tub (G).

3. A housing according to claim 1 further characterized in that the outer edges (AS) of the heat conducting body (SC2) touching a side part (WS/WL) are bent toward the cover (W).

4. A housing according to claim 1 further characterized in that at least one of the side parts (WS/WL) also comprises a section which touches a face of the heat conducting body (SC, SC2) which is pivoted by at least 45° against that outer edge or face (AS) of the heat conducting body which other sections of this side part (WS/WL) touch.

5. A housing according to claim 1 characterized in that the spring unit comprises at least three side parts, of which at least the third side part braces itself in a third lateral gap between the heat conducting body (SC2) and a third sidewall (G1) of the bottom tub (G) oriented substantially perpendicular to the two mutually opposite other sidewalls (G1).

6. A housing according to claim 1 further characterized in that the heat conducting body (SC/SC2) consists of a CuMo alloy.

7. A housing according to claim 1 further characterized in that the spring plate (FE/WS/WL) consists of a CuNiBe alloy.

8. A housing according to claim 1 characterized in that between the heat conducting body (SC2) and the circuit component formed by a separate housingless semiconductor chip (IC), a good heat conducting flat support (SC1), which carries also leads to the semiconductor chip (IC) as well as the semiconductor chip (IC) itself, is inserted.

9. A housing according to claim 8 further characterized by the support (SC1) carrying electrically uninsulated leads on its underside toward the heat conducting body, the support being glued at its underside onto the heat conducting body (SC2) with two kinds of adhesives, namely one part of the leads of the underside of the ceramic support being glued by means of an electrically insulating adhesive while another part of the leads of this underside of the support (SC1) by means of an electrically (e.g. ground potential) conducting adhesive.

10. A housing according to claim 1 further characterized in that the cover (W), after filling of the housing cavity with an inert gas such as water vapor-free He—N$_2$ mixtures, is fastened hermetically tight on the bearing surface of the sidewalls (G1).

* * * * *